US012620810B2

(12) United States Patent
Chen et al.

(10) Patent No.: US 12,620,810 B2
(45) Date of Patent: May 5, 2026

(54) POWER CONVERTER ANALOG CHIP AND POWER CONVERTER

(71) Applicant: Huawei Digital Power Technologies Co., Ltd., Shenzhen (CN)

(72) Inventors: Dong Chen, Shanghai (CN); Zhen Cao, Shanghai (CN); Xiaofeng Yao, Shenzhen (CN); Jiebin Cheng, Dongguan (CN); Guilei Gu, Shanghai (CN)

(73) Assignee: HUAWEI DIGITAL POWER TECHNOLOGIES CO., LTD., Shenzhen (CN)

( * ) Notice: Subject to any disclaimer, the term of this patent is extended or adjusted under 35 U.S.C. 154(b) by 876 days.

(21) Appl. No.: 17/964,128

(22) Filed: Oct. 12, 2022

(65) Prior Publication Data
US 2023/0115497 A1     Apr. 13, 2023

(30) Foreign Application Priority Data
Oct. 13, 2021     (CN) .......................... 202111194553.1

(51) Int. Cl.
*H02J 3/38*          (2026.01)
*H02M 1/32*          (2007.01)
(Continued)

(52) U.S. Cl.
CPC ............. *H02J 3/381* (2013.01); *H02M 1/322* (2021.05); *H02M 1/36* (2013.01); *H02M 3/1582* (2013.01);
(Continued)

(58) Field of Classification Search
CPC ...... H02J 3/381; H02J 2300/26; H02M 1/322; H02M 3/1582; H03K 17/0822; Y02E 10/56
See application file for complete search history.

(56) References Cited

U.S. PATENT DOCUMENTS 8,965,589 B2     2/2015  Zhao
10,454,417 B2 *  10/2019  Matsuoka ............. H02M 7/537
(Continued)

FOREIGN PATENT DOCUMENTS

CN        102156504 B     10/2013
CN        107017836 A     8/2017
(Continued)

OTHER PUBLICATIONS

Zhang Danyan et al., "Design of a Analog Maximum Power Point Tracking Control IC Based on Perturb-and-Observe Algorithm," 2012 IEEE, 4 pages.

*Primary Examiner* — Rafael O De Leon Domenech
(74) *Attorney, Agent, or Firm* — Conley Rose, P.C.

(57)                ABSTRACT

A power converter analog chip includes a sampling circuit configured to collect electrical parameters of the power converter; a maximum power point tracking circuit configured to perform maximum power point tracking based on the input power or the output power obtained by the electrical parameters, and to obtain an adjustment signal; a rapid shutdown circuit configured to, when receiving a rapid shutdown instruction sent from the outside of the analog chip, generate a rapid shutdown signal; a protection circuit, configured to, when an electrical parameter of the power converter exceeds a first preset threshold, generate a protection signal and send the protection signal to the multiplexer; and a multiplexer configured to select one of the rapid shutdown signal, the protection signal, or the adjustment signal as a control signal, to control a power component in the power converter.

20 Claims, 6 Drawing Sheets

300

(51) Int. Cl.
*H02M 1/36* (2007.01)
*H02M 3/158* (2006.01)
*H03K 17/082* (2006.01)

(52) U.S. Cl.
CPC ...... *H03K 17/0822* (2013.01); *H02J 2300/26* (2020.01); *Y02E 10/56* (2013.01)

(56) References Cited

U.S. PATENT DOCUMENTS

| | | | |
|---|---|---|---|
| 11,190,022 B2 * | 11/2021 | Hester ..................... | H02J 3/381 |
| 2012/0265354 A1 | 10/2012 | Zhao | |
| 2012/0319489 A1 | 12/2012 | Mccaslin et al. | |
| 2014/0103892 A1 * | 4/2014 | McJimsey ............... | H02J 3/381 |
| | | | 323/271 |
| 2016/0087579 A1 * | 3/2016 | Moslehi ................ | H10F 19/908 |
| | | | 136/251 |
| 2016/0322834 A1 | 11/2016 | Carpenter, Jr. et al. | |
| 2019/0089300 A1 | 3/2019 | Matsuoka et al. | |
| 2020/0251907 A1 | 8/2020 | Hester et al. | |

FOREIGN PATENT DOCUMENTS

| | | |
|---|---|---|
| CN | 107154780 A | 9/2017 |
| CN | 109638878 A | 4/2019 |
| JP | 2017108553 A | 6/2017 |

* cited by examiner

POWER CONVERTER ANALOG CHIP AND POWER CONVERTER

CROSS-REFERENCE TO RELATED APPLICATION

This application claims priority to Chinese Patent Application No. 202111194553.1, filed on Oct. 13, 2021, which is hereby incorporated by reference in its entirety.

TECHNICAL FIELD

This application relates to the field of photovoltaic power generation technologies, and in particular, to a power converter analog chip and a power converter.

BACKGROUND

The photovoltaic power generation system usually includes a photovoltaic module and a power converter. The photovoltaic module can convert solar energy into electric energy.

Currently, the photovoltaic module includes a plurality of photovoltaic substrings, and each photovoltaic substring includes a plurality of photovoltaic cells. A plurality of photovoltaic modules may be connected in series or in parallel to form a photovoltaic array. A diode is connected between two ends of each photovoltaic substring of the photovoltaic module in parallel. When the photovoltaic sub string cannot output enough currents due to shadow shielding, the diode may bypass the photovoltaic substring, and currents of the other photovoltaic substrings can flow through the diode, to ensure that the other photovoltaic substrings can continue generating power. However, in this manner, the diode completely bypasses the shielded photovoltaic substring. Consequently, the shielded photovoltaic sub string completely cannot generate power, causing a waste of a power generation capability of the photovoltaic substring.

In order that a photovoltaic substring can continue generating power when being shielded, a power converter may be connected between two ends of the photovoltaic substring or two ends of the photovoltaic module, to replace the parallel diode with the power converter. When the photovoltaic substring is shielded by a shadow, an output current of the photovoltaic substring decreases but can still output power. The power converter may convert the output power of the photovoltaic substring, and adjust an output current of the power converter to a current equal to those of the other photovoltaic substrings or power converters connected to the photovoltaic substrings, to improve power generation efficiency of the entire photovoltaic power generation system.

Currently, the power converter is controlled by a digital chip. However, if there is a relatively large quantity of photovoltaic substrings in the photovoltaic power generation system, a relatively large quantity of power converters is also required. If each power converter requires one digital chip, a relatively large quantity of digital chips is required. Consequently, costs of the entire photovoltaic power generation system are relatively high.

SUMMARY

To resolve the foregoing technical problem, this application provides a power converter analog chip and a power converter, to control working of the power converter, thereby reducing costs of a photovoltaic power generation system.

This application provides a power converter analog chip, configured to control working of a power converter. In an example, the analog chip may control a switching status of a power component in the power converter. This application provides an example in which the power converter is applied to a photovoltaic system. The analog chip includes a sampling circuit, a maximum power point tracking circuit, a protection circuit, a rapid shutdown circuit, and a multiplexer. The sampling circuit collects electrical parameters of the power converter, where an input end of the power converter is configured to be connected to a photovoltaic module. The maximum power point tracking circuit obtains input power and/or output power of the power converter based on the electrical parameters, and performs maximum power point tracking based on the input power or the output power, to obtain an adjustment signal and send the adjustment signal to the multiplexer. When receiving a rapid shutdown instruction sent from the outside of the analog chip, the rapid shutdown circuit generates a rapid shutdown signal and sends the rapid shutdown signal to the multiplexer. When an electrical parameter of the power converter exceeds a first preset threshold, the protection circuit generates a protection signal and sends the protection signal to the multiplexer. The multiplexer selects one of the rapid shutdown signal, the protection signal, or the adjustment signal as a control signal, to control the power component in the power converter. The electrical parameters may include an input voltage, an input current, an output voltage, an output current, and a temperature of the power converter. The electrical parameters collected by the sampling circuit are sent to both the maximum power point tracking circuit and the protection circuit.

The circuits in the analog chip provided in this application are all built by using analog circuits, that is, the analog chip is implemented by using an analog integrated circuit, and processes an analog signal. The analog chip can implement maximum power point tracking (MPPT) of the photovoltaic module, so that the photovoltaic system works at relatively high-power generation efficiency. In addition, the analog chip can further implement a protection function and a rapid shutdown function of the power converter. That is, when an electrical parameter of the power converter exceeds a threshold, the analog chip performs protection in time, that is, reduces the electrical parameter to prevent damage to the power converter. For example, the analog chip implements overvoltage, overcurrent, or overtemperature protection for the power converter in an abnormal case, to prevent damage to or further fault spreading of the power converter. In addition, when rapid shutdown is required, the analog chip controls the power converter to stop working. Because the analog chip has a high integration degree and low costs, even if the photovoltaic system includes a relatively large quantity of photovoltaic modules, costs are not too high, so that system costs can be reduced compared with a digital chip.

In a possible implementation, a multiplexer of the analog chip may further control the power component based on priorities of the signals, and is configured to select the control signal from the rapid shutdown signal, the protection signal, and the adjustment signal in descending order of the priorities. In addition, when rapid shutdown is required, the multiplexer controls the power converter to stop working. A rapid shutdown level is higher than a protection level, and the protection level is higher than an MPPT level. The multiplexer may, in an example, shut down the power converter and stop working of the power converter when the power converter needs to be shut down; and second protect the power converter when the power converter is in an abnormal case, and maintain working of the power converter in a normal case. An external controller of the analog chip may send the rapid shutdown instruction to the analog chip. The external controller may be a controller of an inverter or a controller of a combiner box, or may be another host computer.

In a possible implementation, the analog chip further includes a communication circuit connected to both the rapid shutdown circuit and the sampling circuit. The communication circuit performs bi-directional communication, that is, can forward, to the internal circuits of the analog chip, a command sent by the external controller of the analog chip, and can also forward working statuses of the internal circuits of the analog chip to the controller, so that the controller monitors operation of the analog chip. The communication circuit is configured to forward, to the rapid shutdown circuit, the rapid shutdown instruction sent by the controller; and is further configured to send the electrical parameters of the power converter that are collected by the sampling circuit to the controller. The controller is configured to monitor operation of the power converter based on the electrical parameters.

In a possible implementation, the communication circuit is further connected to the multiplexer. The communication circuit sends the control signal and/or a control signal selection result of the multiplexer to the controller; and/or the communication circuit sends, to the multiplexer, a mandatory selection instruction sent by the controller, where the multiplexer selects the control signal from the rapid shutdown signal, the protection signal, and the adjustment signal based on the mandatory selection instruction. The mandatory selection instruction delivered by the controller by using the communication circuit is an adjustment signal. In this case, the multiplexer discards the protection signal, and controls operation of the power converter based on the adjustment signal delivered by the controller.

In a possible implementation, the maximum power point tracking circuit includes a multiplier, a maximum power point tracker, and a voltage processor. The multiplier is configured to obtain the input power and/or the output power based on the voltages and the currents in the electrical parameters. The maximum power point tracker is configured to perform maximum power point tracking based on the input power or the output power, to obtain a voltage reference value. The voltage processor is configured to obtain the adjustment signal based on the voltage reference value and the input voltage or the output voltage in the electrical parameters.

In a possible implementation, the maximum power point tracking circuit further includes a voltage simulator. The voltage simulator is configured to obtain a voltage preset value based on a preset coefficient and a voltage in the electrical parameters, where the voltage in the electrical parameters includes the input voltage or the output voltage. The voltage processor is configured to compare the voltage reference value with the voltage preset value to obtain a comparison result, and obtain the adjustment signal based on the comparison result and the input voltage or the output voltage in the electrical parameters.

In a possible implementation, the maximum power point tracker is further configured to store, as memory power, the input power or the output power that is sent by the multiplier, and compare real-time power of the photovoltaic module with the memory power to obtain the voltage reference value. In other words, the maximum power point tracker has a memory function. The maximum power point tracker is further configured to receive and store the input power or the output power that is sent by the multiplier, that is, use, as the memory power, the input power or the output power that is sent by the multiplier, and compare the real-time power of the photovoltaic module with the memory power to obtain the voltage reference value. The real-time power of the photovoltaic module is also power obtained by the multiplier. In addition, an example MPPT tracking manner is not limited in this embodiment of this application. For example, in a possible implementation, the maximum power point tracker may obtain the voltage reference value by using a disturbance observation method. That is, when the voltage reference value is increased or decreased, values of the real-time power of the photovoltaic module and the memory power that are observed when the voltage reference value changes are compared. If the real-time power is greater than the memory power, the voltage reference value continues being increased or decreased in an original change direction; otherwise, the voltage reference value is increased or decreased in a direction opposite to the original change direction. For example, when the voltage reference value is increased, if the real-time power is greater than the memory power, the voltage reference value continues being increased; otherwise, the voltage reference value is decreased.

In a possible implementation, the voltage processor is further configured to, when a parameter represented by the adjustment signal exceeds a second preset threshold, control, by using the control signal, the power converter to work in a pass-through mode.

In a possible implementation, the communication circuit is further connected to the maximum power point tracking circuit. The communication circuit is further configured to send, to the controller, power of the power converter or the adjustment signal that is obtained by the maximum power point tracking circuit; and/or configured to send a power adjustment instruction of the controller for the maximum power point tracking circuit to the maximum power point tracking circuit, where the power adjustment instruction is used to adjust the power of the power converter or the adjustment signal in the maximum power point tracking circuit, and the power of the power converter is the input power and/or the output power.

In a possible implementation, the communication circuit is further connected to the maximum power point tracking circuit. The communication circuit is further configured to send the voltage reference value to the controller; and/or the communication circuit is configured to forward, to the voltage processor, an instruction that is for adjusting the voltage reference value and that is sent by the controller.

In a possible implementation, the communication circuit is further connected to the maximum power point tracking circuit. The communication circuit is further configured to send at least one of the preset coefficient, the voltage preset value, or the voltage reference value to the controller; and/or configured to forward, to the voltage processor, an instruction that is for adjusting at least one of the preset coefficient, the voltage preset value, or the voltage reference value and that is sent by the controller.

In a possible implementation, the communication circuit is further connected to the protection circuit. The communication circuit is further configured to send the first preset threshold and the protection signal of the protection circuit to the controller; and is further configured to receive a protection adjustment instruction sent by the controller and send the protection adjustment instruction to the protection circuit, where the protection adjustment instruction is used to adjust the first preset threshold or the protection signal.

The internal circuits of the analog chip provided in this embodiment are all connected to the communication circuit, and therefore can receive, by using the communication circuit, instructions sent by the external controller, so that the external controller can forcibly adjust working parameters of the circuits. In addition, the communication circuit may also send working statuses and parameters of the circuits to the external controller of the analog chip, so that the external controller monitors the working statuses of the circuits, thereby implementing dual monitoring assurance. The analog chip includes the communication circuit. Therefore, transmission ranges of the signals can be expanded, and availability of the analog chip can be enhanced, so that the photovoltaic power generation system implements monitoring of working parameters and electrical parameters of the photovoltaic module and the power converter, to improve communication ranges of the adjustment signal, the rapid shutdown signal, and the protection signal, thereby helping further reduce costs of the photovoltaic power generation system.

In a possible implementation, when the control signal is the protection signal, the control signal is used to control the power converter to perform a pulse-by-pulse current limit, or control the power converter to stop working. An example implementation of the pulse-by-pulse current limit is described by using an example in which the power converter is of a BUCK topology. The control signal that is output by the analog chip is used to control conduction time of a main switching transistor to decrease period by period until the main switching transistor is not conducted. In this process, a current flowing from the input end of the power converter to an output end gradually decreases, to implement protection of the main switching transistor and a passive switching transistor. The pulse-by-pulse current limit protection can prevent a temporary overvoltage or overcurrent phenomenon from occurring in the switching transistors in the power converter in a protection process, to protect the switching transistors. Based on different application scenarios and circuit topologies, if no overvoltage or overcurrent phenomenon occurs in the switching transistors in the protection process, the protection signal may be alternatively used to directly stop working of the power converter for protection.

In a possible implementation, when communication between the rapid shutdown module and the controller is abnormal, the rapid shutdown circuit is configured to generate the rapid shutdown signal and send the rapid shutdown signal to the multiplexer.

In a possible implementation, when the control signal is the rapid shutdown signal, the control signal is used to control the power converter to be rapidly discharged, or control the power converter to stop working.

In a possible implementation, the analog chip further includes a curve scanning circuit. The curve scanning circuit is configured to, when receiving a scanning instruction, generate a curve scanning start signal and send the curve scanning start signal to the multiplexer. The multiplexer is configured to select the control signal from the rapid shutdown signal, the protection signal, the curve scanning start signal, and the adjustment signal in descending order of priorities. When the curve scanning start signal is used as the control signal, the control signal is used to control the power converter to perform curve scanning on the input voltage and the input current or perform curve scanning on the output voltage and the output current.

In a possible implementation, the communication circuit is further connected to the curve scanning circuit. The communication circuit is configured to send the curve scanning start signal and a curve scanning mode of the curve scanning circuit to the controller; and is further configured to send, to the curve scanning circuit, a scanning adjustment instruction sent by the controller, where the scanning adjustment instruction is used to adjust the curve scanning mode and the curve scanning start signal. The analog chip provided in this application further has a current-voltage characteristic curve (I-V curve) scanning function, for example, may implement scanning of an input-current-input-voltage curve of the power converter, or may implement scanning of an output-current-output-voltage curve of the power converter, to implement monitoring of a voltage-current characteristic of the photovoltaic module, thereby improving monitoring and adjustment capabilities of the photovoltaic power generation system.

This application further provides a power converter, including a power conversion circuit and the foregoing described analog chip. An input end of the power converter is configured to be connected to a photovoltaic module, and the output end of the power converter is configured to be connected to a combiner box or an inverter. The analog chip is configured to output a control signal to the power converter, where the control signal is used to control the power conversion circuit.

This application has at least the following advantages.

The analog chip includes the sampling circuit, the maximum power point tracking circuit, the protection circuit, the rapid shutdown circuit, and the multiplexer. The circuits included in the analog chip are all built by using analog circuits, that is, the analog chip is implemented by using an analog integrated circuit, and processes an analog signal. The analog chip can implement MPPT of the photovoltaic module, so that the photovoltaic system works at relatively high-power generation efficiency. In addition, the analog chip can further implement a protection function and a rapid shutdown function of the power converter. That is, when an electrical parameter of the power converter exceeds a threshold, the analog chip performs protection in time, that is, reduces the electrical parameter to prevent damage to the power converter. In addition, when rapid shutdown is required, the analog chip controls the power converter to stop working. A rapid shutdown level is higher than a protection level, and the protection level is higher than an MPPT level. Because the analog chip has a high integration degree and low costs, even if the photovoltaic system includes a relatively large quantity of photovoltaic modules, costs are not very high, so that system costs can be reduced compared with a digital chip.

DESCRIPTION OF EMBODIMENTS

The following describes technical solutions in embodiments of this application with reference to the accompanying drawings in embodiments of this application.

The term such as "first" or "second" in the following description is merely intended for a purpose of description, and cannot be understood as an indication or implication of relative importance or an implicit indication of a quantity of indicated technical features. Therefore, a feature limited by "first" or "second" may explicitly indicate or implicitly include one or more such features. In the descriptions of this application, unless otherwise stated, "a plurality of" means two or more than two.

In this application, unless otherwise specified and limited, the term "connection" should be broadly understood. For example, the "connection" may be a fixed connection, or may be a detachable connection or an integral connection; or may be a direct connection, or may be an indirect connection implemented by using an intermediate medium. In addition, the term "coupling" may be an electrical connection manner of implementing signal transmission. The "coupling" may be a direct electrical connection, or may be an indirect electrical connection implemented by using an intermediate medium.

To enable a person skilled in the art to better understand the technical solutions provided in the embodiments of this application, the following first describes an application scenario of the technical solutions with reference to the accompanying drawings.

The embodiments of this application relate to a power converter analog chip. The analog chip is configured to control working of a power converter, that is, the analog chip may output a drive signal, for example, a drive signal of a pulse width modulation scheme, to a switching transistor in the power converter, to drive a switching action of the switching transistor, so that the power converter implements electric energy conversion. The power converter is connected to a photovoltaic module or a photovoltaic substring, and is configured to perform electric energy conversion on the photovoltaic module or the photovoltaic substring. In addition, the power converter may be alternatively connected to a plurality of photovoltaic modules. The power converter is a direct current-direct current (DC-DC) converter or a direct current-alternating current (DC-AC) converter. For example, the power converter may perform boosting, bucking, or bucking-boosting on a voltage of the photovoltaic module, or convert the voltage to an alternating current voltage.

Figure 1:
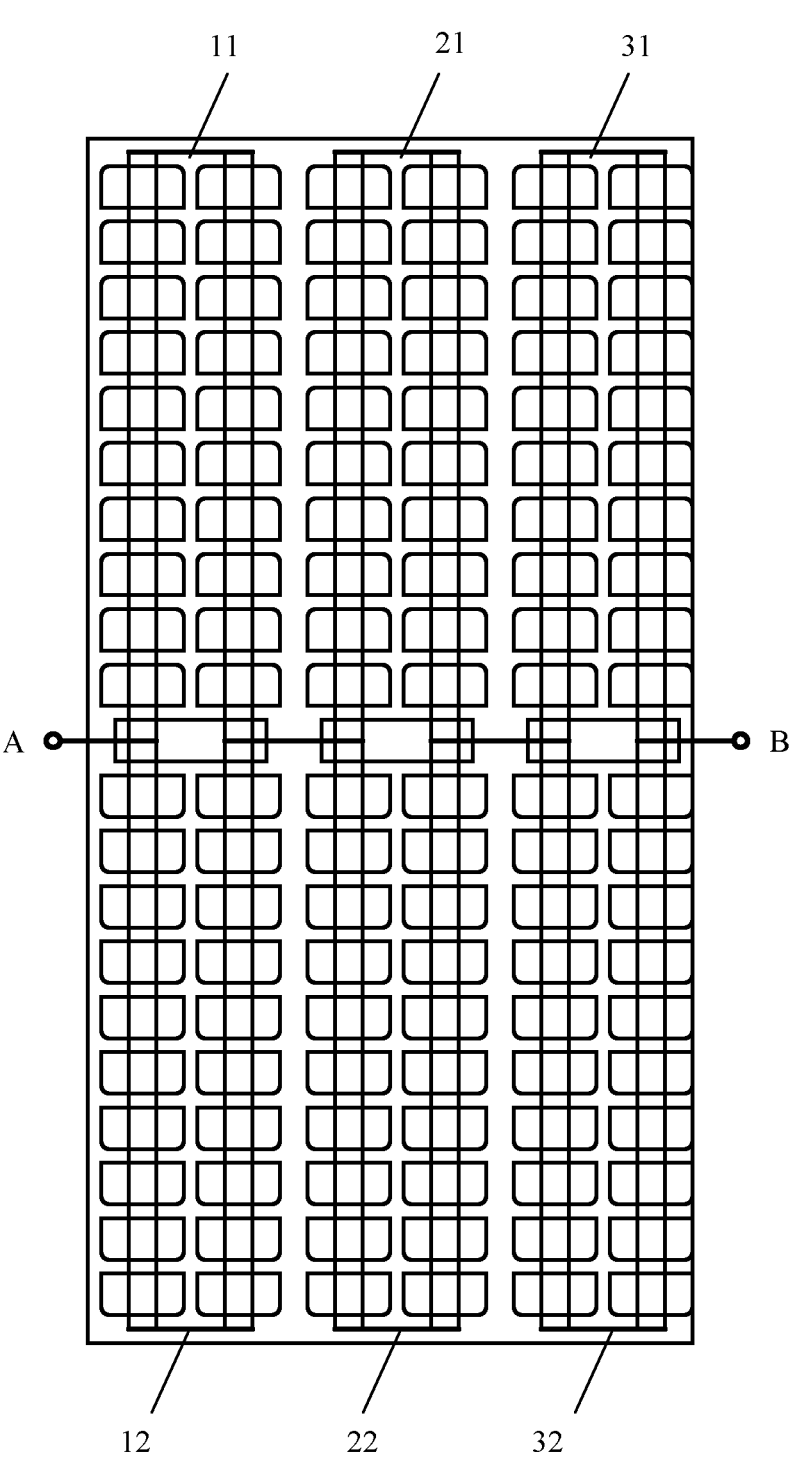
FIG. 1 is a schematic diagram of a photovoltaic module according to an embodiment of this application.

FIG. 1 is a schematic diagram of a photovoltaic module according to an embodiment of this application.

This embodiment is merely a possible implementation of the photovoltaic module, and one photovoltaic module includes three photovoltaic substrings. An example implementation of the photovoltaic substring is as follows. After a single photovoltaic cell is split into two half cells, the half photovoltaic cells are connected in series and then connected in parallel to form an internal photovoltaic substring of the photovoltaic module. It can be learned from FIG. 1 that a first photovoltaic substring includes a half cell string 11 and a half cell string 12 that are connected in parallel, a second photovoltaic substring includes a half cell string 21 and a half cell string 22 that are connected in parallel, and a third photovoltaic substring includes a half cell string 31 and a half cell string 32 that are connected in parallel.

The three photovoltaic substrings form an entire photovoltaic module after being connected in series. Two series ports are external output ports, namely, a port A and a port B. A plurality of photovoltaic modules may also be connected in series or in parallel to form a photovoltaic array, thereby implementing external power generation.

A quantity of photovoltaic modules corresponding to one power converter is not limited in this embodiment of this application. For example, the photovoltaic module shown in FIG. 1 may correspond to one power converter, or each photovoltaic sub string may correspond to one power converter, for example, the three photovoltaic substrings correspond to three power converters in total.

In the following embodiments of this application, for ease of description, an example in which one photovoltaic module corresponds to one power converter is used for description.

Analog Chip Embodiment

Because a photovoltaic power generation system includes a very large quantity of photovoltaic modules, a very large quantity of power converters are also required. If the power converter is controlled by using a digital chip, because a price of the digital chip is relatively high, costs of the entire photovoltaic power generation system are relatively high. To reduce costs, an embodiment of this application provides a power converter analog chip. The following describes the analog chip in detail with reference to the accompanying drawings.

Figure 2:
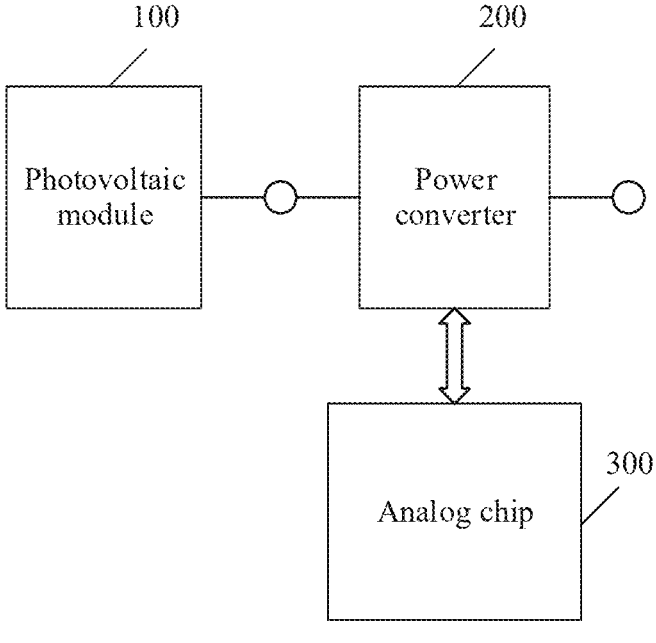
FIG. 2 is a schematic diagram of an application scenario of a power converter analog chip according to an embodiment of this application.

FIG. 2 is a schematic diagram of an application scenario of a power converter analog chip according to an embodiment of this application.

A power converter 200 includes an input end and an output end. An output end of a photovoltaic module 100 is connected to the input end of the power converter 200. The power converter 200 converts power of the photovoltaic module 100 and transmits converted power to the output end.

An analog chip 300 is a single integrated circuit chip, and is configured to implement control on the power converter, that is, send a drive signal to a switching transistor in the power converter 200, to control a switching status of the switching transistor. For example, when a level of the drive signal is a high level, the switching transistor is conducted; or when a level of the drive signal is a low level, the switching transistor is shut down.

Figure 3:
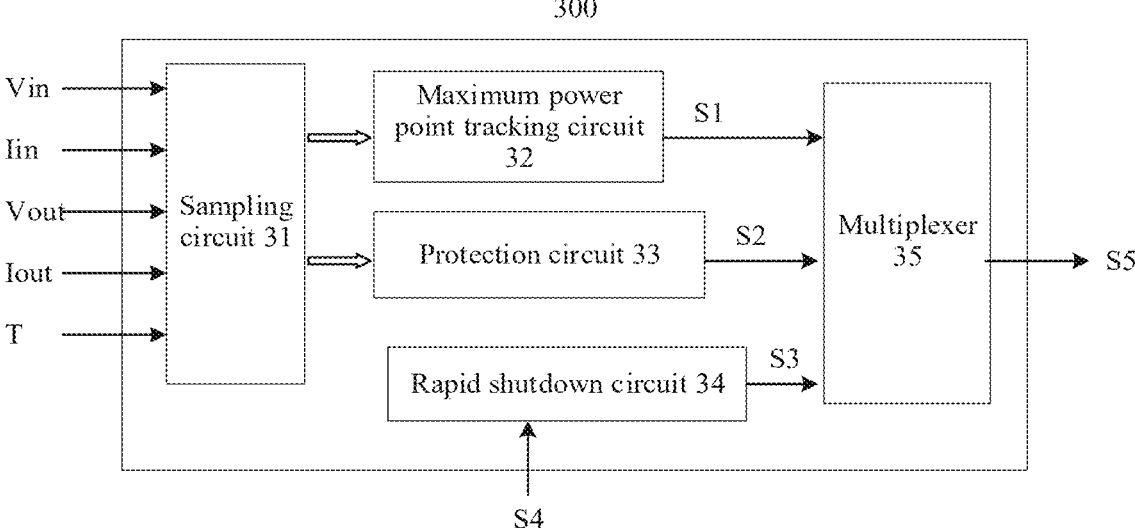
FIG. 3 is a schematic diagram of a power converter analog chip according to an embodiment of this application.

FIG. 3 is a schematic diagram of a power converter analog chip according to an embodiment of this application.

A power converter analog chip 300 provided in this embodiment includes a sampling circuit 31, a maximum power point tracking circuit 32, a protection circuit 33, a rapid shutdown circuit 34, and a multiplexer 35.

The sampling circuit 31 is configured to collect electrical parameters of a power converter, where an input end of the power converter is configured to be connected to a photovoltaic module. The electrical parameters may include an input voltage Vin, an input current Iin, an output voltage Vout, an output current Iout, and a temperature T of the power converter. Because the input end of the power converter is connected to the photovoltaic module, the input voltage Vin and the input current Iin are respectively an output voltage and an output current of the photovoltaic module. The electrical parameters collected by the sampling circuit 31 are sent to both the maximum power point tracking circuit 32 and the protection circuit 33.

The maximum power point tracking circuit 32 is configured to obtain input power and/or output power of the power converter based on the electrical parameters, and perform MPPT based on the input power or the output power, to obtain an adjustment signal S1 and send the adjustment signal S1 to the multiplexer 35.

The input voltage Vin and the input current Iin of the power converter are multiplied to obtain the input power, and the output voltage Vout and the output current Iout are multiplied to obtain the output power. The maximum power point tracking circuit 32 may perform MPPT based on the input power, may perform MPPT based on the output power, or may perform MPPT based on the input power and the output power. This is not limited in this embodiment. When a power loss is ignored, the maximum power point tracking circuit 32 may also obtain real-time power of the photovoltaic module based on the input voltage Vin and the input current Iin.

The maximum power point tracking circuit 32 may obtain, based on an MPPT algorithm, a voltage reference value required for tracking a maximum power point of the photovoltaic module, to implement maximum power point tracking.

The protection circuit 33 is configured to, when an electrical parameter of the power converter exceeds a first preset threshold, generate a protection signal S2 and send the protection signal S2 to the multiplexer 35.

When the input voltage of the power converter exceeds a first preset voltage threshold, the input current of the power converter exceeds a first preset current threshold, the output voltage of the power converter exceeds a second preset voltage threshold, the output current of the power converter exceeds a second preset current threshold, or the temperature of the power converter exceeds a preset temperature threshold, a valid protection signal S2 is generated and sent to the multiplexer 35. When selecting the protection signal S2 as a control signal, the multiplexer 35 implements overvoltage, overcurrent, or overtemperature protection for the power converter in an abnormal case, to prevent damage to or further fault spreading of the power converter.

The foregoing is merely an example for description. In addition, the protection circuit 33 may detect only one or more of the input voltage, the input current, the output voltage, the output current, and the temperature for protection based on an actual requirement.

The rapid shutdown circuit 34 is configured to, when receiving a rapid shutdown instruction S4 sent from the outside of the analog chip, generate a rapid shutdown signal S3 and send the rapid shutdown signal S3 to the multiplexer 35. An external controller of the analog chip may send the rapid shutdown instruction S4 to the analog chip. The controller may be a controller of an inverter or a controller of a combiner box, or may be another host computer.

The rapid shutdown signal S3 may be a normally-off signal.

When selecting the rapid shutdown signal S3 as a control signal, the multiplexer 35 rapidly reduces the output voltage of the power converter to at most a safe voltage. If there also is a risk that the connection between the input end of the power converter and the photovoltaic module is exposed to a person or another device, the multiplexer 35 also rapidly reduces the input voltage of the power converter to at most the safe voltage. Therefore, when the photovoltaic power generation system requires the power converter to be rapidly shut down, a voltage of the power converter is rapidly reduced, and finally working of the power converter is stopped, thereby protecting the person and another device.

The multiplexer 35 is configured to select one of the rapid shutdown signal S3, the protection signal S2, or the adjustment signal S1 as a control signal S5, to control a power component in the power converter. In other words, S5 may be one of S1, S2, or S3, and may be selected based on an actual requirement.

In a possible implementation, priorities may be set based on an actual requirement. For example, the control signal S5 is selected from the rapid shutdown signal S3, the protection signal S2, and the adjustment signal S1 in descending order of the priorities. That is, S3 has a highest priority, S2 has a second highest priority, and S1 has a lowest priority. That is, when S1, S2, and S3 are all valid, the multiplexer 35 selects S3 as the control signal for outputting, in other words, S5=S3. When S2 and S1 are both valid, the multiplexer 35 selects S2 as the control signal for outputting, in other words, S5=S2. When only S1 is valid, the multiplexer 35 selects S1 as the control signal for outputting, in other words, S5=S1.

The multiplexer 35 may, in an example, shut down the power converter and stop working of the power converter when the power converter needs to be shut down; and second protect the power converter when the power converter is in an abnormal case, and maintain working of the power converter in a normal case.

The circuits included in the analog chip provided in this embodiment of this application are all built by using analog circuits, that is, the analog chip is implemented by using an analog integrated circuit. The analog chip can implement MPPT of the photovoltaic module, so that the photovoltaic system works at relatively high-power generation efficiency. In addition, the analog chip can further implement a protection function and a rapid shutdown function of the power converter. That is, when an electrical parameter of the power converter exceeds a threshold, the analog chip performs protection in time, that is, reduces the electrical parameter to prevent damage to the power converter. In addition, when rapid shutdown is required, the analog chip controls the power converter to stop working. A rapid shutdown level is higher than a protection level, and the protection level is higher than an MPPT level. Because the analog chip has a high integration degree and low costs, even if the photovoltaic system includes a relatively large quantity of photovoltaic modules, costs are not too high, so that system costs can be reduced compared with a digital chip.

In addition to the MPPT function, protection function, and rapid shutdown function, the analog chip provided in this embodiment of this application further has a communication function. The following describes the communication function in detail with reference to the accompanying drawings.

Figure 4:
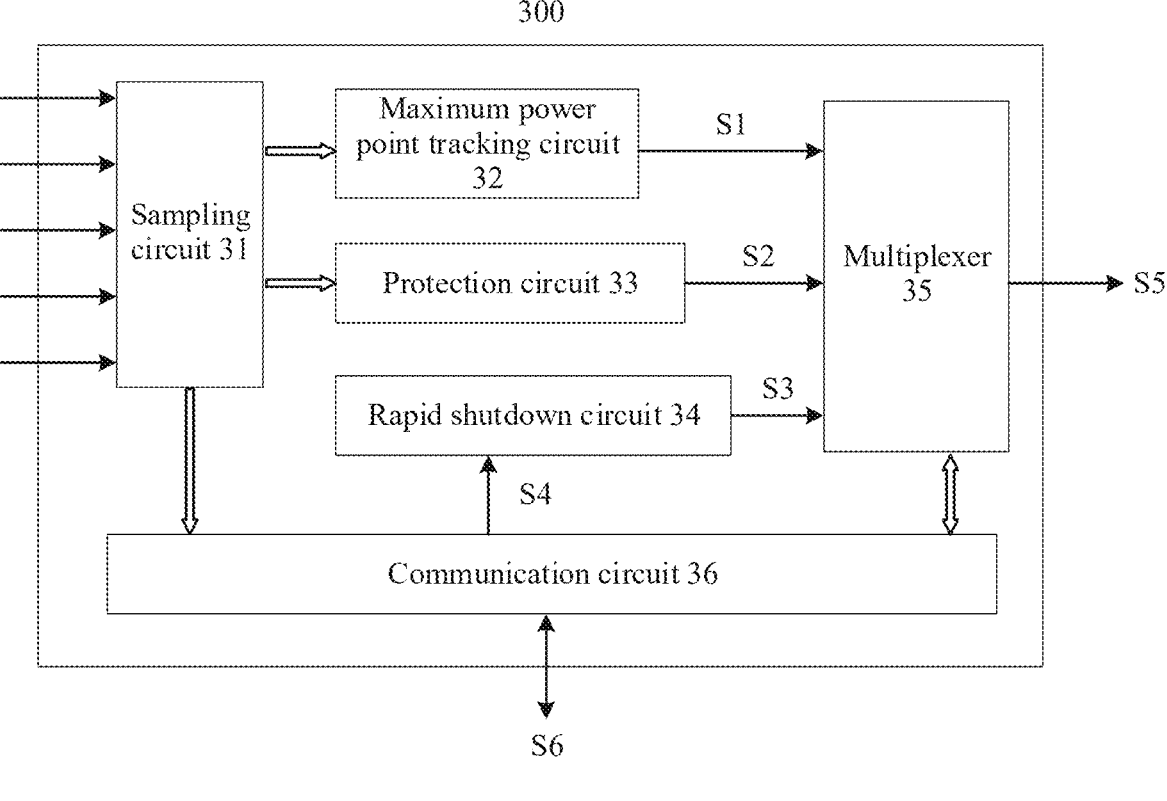
FIG. 4 is a schematic diagram of another analog chip according to an embodiment of this application.

FIG. 4 is a schematic diagram of another analog chip according to an embodiment of this application.

The analog chip 300 further includes a communication circuit 36 connected to both the rapid shutdown circuit 34 and the sampling circuit 31. The communication circuit 36 performs bi-directional communication, that is, can forward, to the internal circuits of the analog chip, a command sent by the external controller of the analog chip, and can also forward working statuses of the internal circuits of the analog chip to the controller, so that the controller monitors operation of the analog chip.

The communication circuit 36 is connected to the rapid shutdown circuit 34, and is configured to forward, to the rapid shutdown circuit 34, the rapid shutdown instruction S4 sent by the controller. In addition, the communication circuit 36 is further connected to the sampling circuit 31, and is further configured to send the electrical parameters of the power converter that are collected by the sampling circuit 31 to the controller. The controller monitors operation of the power converter based on the electrical parameters.

In addition, the communication circuit 36 is further connected to the multiplexer 35.

The communication circuit 36 is configured to send the selected control signal and/or a control signal selection result of the multiplexer 35 to the controller; and is further configured to send, to the multiplexer 35, a mandatory selection instruction sent by the controller, where the multiplexer 35 selects the control signal from the rapid shutdown signal, the protection signal, and the adjustment signal based on the mandatory selection instruction. For example, the multiplexer 35 selects, as the control signal, the protection signal that is output by the protection circuit 33, but the mandatory selection instruction delivered by the controller by using the communication circuit 36 is a rapid shutdown signal. In this case, the multiplexer 35 discards the protection signal, and controls operation of the power converter based on the rapid shutdown signal delivered by the controller. Alternatively, for example, the multiplexer 35 selects, as the control signal, the protection signal that is output by the protection circuit 33, but the mandatory selection instruction delivered by the controller by using the communication circuit 36 is an adjustment signal. In this case, the multiplexer 35 discards the protection signal, and controls operation of the power converter based on the adjustment signal delivered by the controller.

Figures 5, 6:
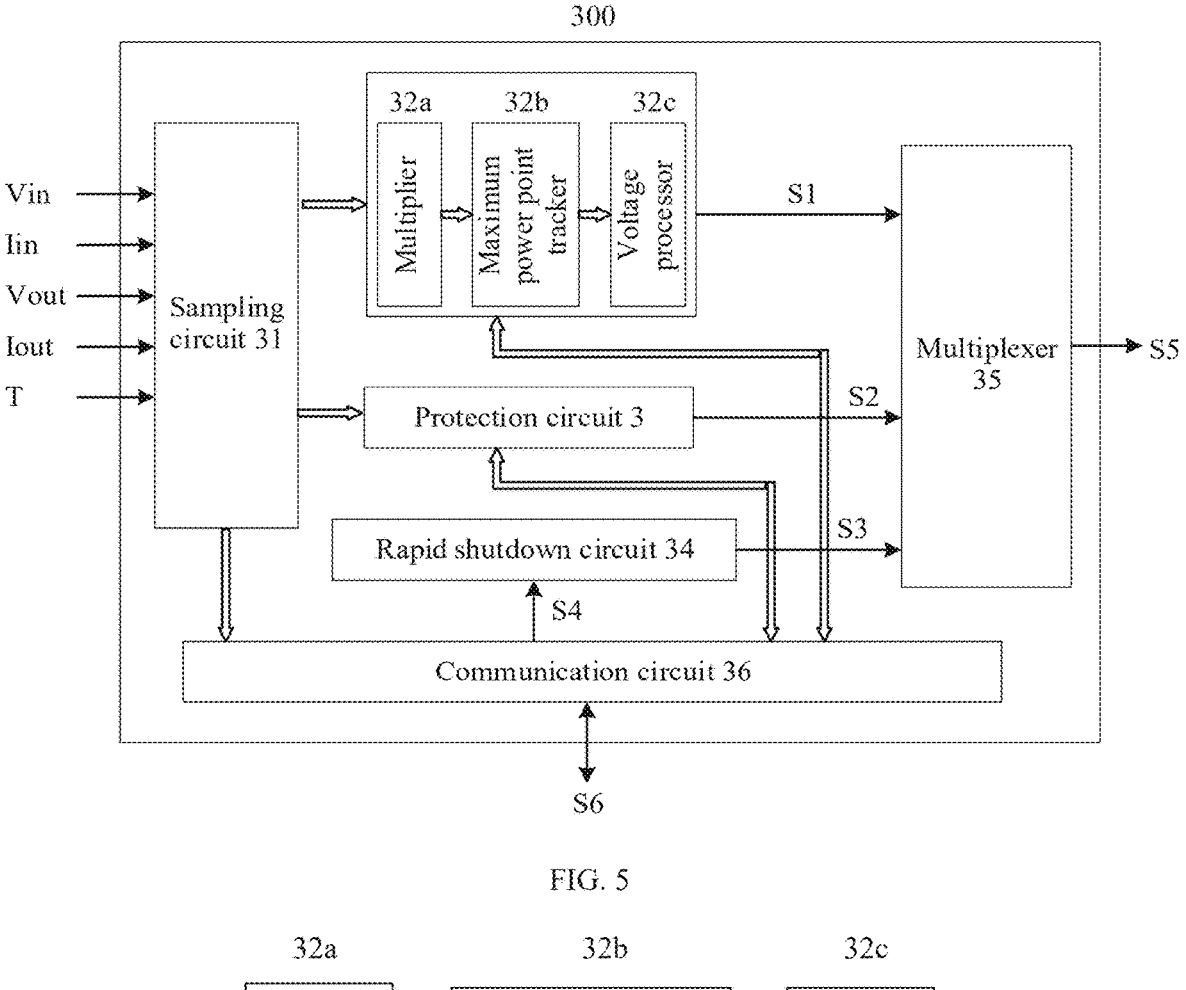
FIG. 5 is a schematic diagram of still another analog chip according to an embodiment of this application.
FIG. 6 is a schematic diagram of a maximum power point tracking circuit according to an embodiment of this application.

FIG. 5 is a schematic diagram of still another analog chip according to an embodiment of this application.

The maximum power point tracking circuit provided in this embodiment of this application may include a multiplier 32a, a maximum power point tracker 32b, and a voltage processor 32c.

The multiplier 32a is configured to receive the electrical parameters sent by the sampling circuit 31. For example, the multiplier 32a multiplies the input voltage and the input current of the power converter to obtain the input power of the power converter, namely, power of the photovoltaic module. Alternatively, the multiplier 32a multiplies the output voltage and the output current of the power converter to obtain the output power of the power converter; and when a power converter loss is ignored, power of the photovoltaic module may also be approximately obtained, where the power is real-time power of the photovoltaic module.

The maximum power point tracker 32b may obtain, based on the power of the photovoltaic module and an MPPT control algorithm, the voltage reference value required for tracking the maximum power point of the photovoltaic module, and send the voltage reference value to the voltage processor 32c. The maximum power point tracker 32b performs maximum power point tracking based on the input power or the output power of the power converter, to obtain the voltage reference value.

The voltage processor 32c obtains the adjustment signal based on the voltage reference value and the input voltage or the output voltage in the electrical parameters.

When the analog chip controls the input voltage of the power converter, the voltage processor 32c compares the voltage reference value with the input voltage of the power converter and performs adjustment, to obtain the adjustment signal. When the analog chip controls the output voltage of the power converter, the voltage processor 32c compares the voltage reference value with the output voltage of the power converter and performs adjustment, to obtain the adjustment signal. In addition, the voltage processor 32c sends the adjustment signal S1 to the multiplexer 35. During normal working, the multiplexer 35 selects the adjustment signal S1 as the control signal, to implement power conversion control of the analog chip 300 for the power converter.

In addition, the communication circuit 36 in the analog chip 300 provided in this embodiment is further connected to the protection circuit 33 and the maximum power point tracking circuit.

The communication circuit 36 is further configured to send, to the controller, power of the power converter or the adjustment signal that is obtained by the maximum power point tracking circuit; and is further configured to send a power adjustment instruction of the controller for the maximum power point tracking circuit to the maximum power point tracking circuit, where the power adjustment instruction is used to adjust the power of the power converter or the adjustment signal in the maximum power point tracking circuit, and the power of the power converter is the input power and/or the output power.

That is, the external controller of the analog chip may send an instruction for adjusting the maximum power point tracking circuit to the analog chip. When receiving a communication signal including the adjustment instruction, the communication circuit may force the maximum power point tracking circuit to adjust a working status, that is, forcibly adjust the power of the photovoltaic module or the adjustment signal.

The communication circuit 36 is further configured to send the voltage reference value of the voltage processor 32c to the controller; and is further configured to forward, to the voltage processor 32c, an instruction that is for adjusting the voltage reference value and that is sent by the controller.

The communication circuit 36 is further configured to send the first preset threshold and the protection signal of the protection circuit to the controller; and is further configured to receive a protection adjustment instruction sent by the controller and send the protection adjustment instruction to the protection circuit, where the protection adjustment instruction is used to adjust the first preset threshold or the protection signal.

The communication circuit 36 may further send a working status of the protection circuit 33 to the outside of the analog chip as a communication signal, to implement monitoring of a working status of the power converter in the photovoltaic power generation system. The working status of the protection circuit 33 is one or several of a current first voltage threshold, first current threshold, second voltage threshold, second current threshold, temperature threshold, or protection signal. In addition, the external controller of the analog chip 300 may also send a working status adjustment instruction to the protection circuit 33. When receiving a communication signal including the adjustment instruction, the communication circuit 36 may force the protection circuit 33 to adjust the working status, that is, forcibly adjust the first voltage threshold, first current threshold, second voltage threshold, second current threshold, temperature threshold, or protection signal.

The internal circuits of the analog chip provided in this embodiment are all connected to the communication circuit, and therefore can receive, by using the communication circuit, instructions sent by the external controller, so that the external controller can forcibly adjust working parameters of the circuits. In addition, the communication circuit may also send working statuses and parameters of the circuits to the external controller of the analog chip, so that the external controller monitors the working statuses of the circuits, thereby implementing dual monitoring assurance. The analog chip includes the communication circuit. Therefore, transmission ranges of the signals can be expanded, and availability of the analog chip can be enhanced, so that the photovoltaic power generation system implements monitoring of working parameters and electrical parameters of the photovoltaic module and the power converter, to improve communication ranges of the adjustment signal, the rapid shutdown signal, and the protection signal, thereby helping further reduce costs of the photovoltaic power generation system.

The maximum power point tracker in the maximum power point tracking circuit provided in this embodiment of this application further has a power memory function. The following describes the power memory function in detail with reference to the accompanying drawings.

FIG. 6 is a schematic diagram of a maximum power point tracking circuit according to an embodiment of this application.

The maximum power point tracker 32b is further configured to receive and store the input power or the output power that is sent by the multiplier 32a, that is, use, as memory power, the input power or the output power that is sent by the multiplier 32a, and compare real-time power of the photovoltaic module with the memory power to obtain the voltage reference value. The real-time power of the photovoltaic module is also power obtained by the multiplier 32a.

In addition, an example MPPT tracking manner is not limited in this embodiment of this application. For example, in a possible implementation, the maximum power point tracker 32b may obtain the voltage reference value by using a disturbance observation method. That is, when the voltage reference value is increased or decreased, values of the real-time power of the photovoltaic module and the memory power that are observed when the voltage reference value changes are compared. If the real-time power is greater than the memory power, the voltage reference value continues being increased or decreased in an original change direction; otherwise, the voltage reference value is increased or decreased in a direction opposite to the original change direction. For example, when the voltage reference value is increased, if the real-time power is greater than the memory power, the voltage reference value continues being increased; otherwise, the voltage reference value is decreased.

Figure 7:
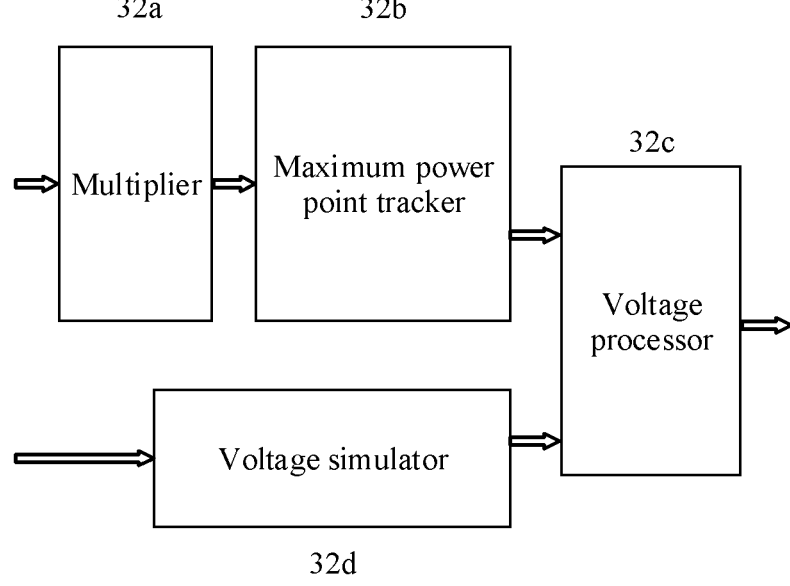
FIG. 7 is a schematic diagram of another maximum power point tracking circuit according to an embodiment of this application.

FIG. 7 is a schematic diagram of another maximum power point tracking circuit according to an embodiment of this application.

The maximum power point tracking circuit further includes a voltage simulator 32d.

The voltage simulator 32d is configured to obtain a voltage preset value based on a preset coefficient and a voltage in the electrical parameters, where the voltage in the electrical parameters includes the input voltage or the output voltage. The preset coefficient may be obtained based on a proportion relationship, or may be obtained based on a curve relationship. This is not limited herein. For example, the voltage simulator 32d may obtain the voltage preset value based on the proportion relationship, namely, a linear function relationship, that is, the voltage simulator 32d may obtain the voltage preset value based on the input voltage and a first preset voltage proportion, or may obtain the voltage preset value based on the output voltage and a second preset voltage proportion. There is no inevitable relationship between the first preset voltage proportion and the second preset voltage proportion.

The voltage processor 32c is configured to compare the voltage reference value with the voltage preset value to obtain a comparison result, and obtain the adjustment signal based on the comparison result and the input voltage or the output voltage in the electrical parameters.

The voltage simulator 32d obtains, based on the input voltage and the first preset voltage proportion, a voltage preset value required by an analog voltage. The voltage reference value obtained by the maximum power point tracker 32b is compared with the voltage preset value obtained by the voltage simulator 32d. The voltage processor 32c further compares a comparison result of the two values with the output voltage of the power converter and performs adjustment, to obtain the adjustment signal, to implement control of the output voltage of the power converter.

Alternatively, the voltage simulator 32d obtains, based on the output voltage and the second preset voltage proportion, a voltage preset value required by an analog voltage. The voltage reference value obtained by the maximum power point tracker 32b is compared with a voltage preset value obtained by the voltage simulator 32d. The voltage processor 32c further compares a comparison result of the two values with the input voltage of the power converter and performs adjustment, to obtain the adjustment signal, to implement control of the input voltage of the power converter.

Alternatively, the voltage simulator 32d obtains, based on the input voltage and the first preset voltage proportion, a voltage preset value required by an analog voltage. The voltage reference value obtained by the maximum power point tracker 32b is compared with the voltage preset value obtained by the voltage simulator 32d. The voltage processor 32c further compares a comparison result of the two values with the input voltage of the power converter and performs adjustment, to obtain the adjustment signal, to implement control of the input voltage of the power converter.

Alternatively, the voltage simulator 32d obtains, based on the output voltage and the second preset voltage proportion, a voltage preset value required by an analog voltage. The voltage reference value obtained by the maximum power point tracker 32b is compared with a voltage preset value obtained by the voltage simulator 32d. The voltage processor 32c further compares a comparison result of the two values with the output voltage of the power converter and performs adjustment, to obtain the adjustment signal, to implement control of the output voltage of the power converter.

Values of the first preset voltage proportion and the second preset voltage proportion are not limited in this embodiment, and the first preset voltage proportion may be the same as or different from the second preset voltage proportion.

The communication circuit is further connected to the maximum power point tracking circuit. The communication circuit is further configured to send at least one of the preset coefficient, the voltage preset value, or the voltage reference value to the controller; and/or is further configured to forward, to the voltage processor, an instruction that is for adjusting at least one of the preset coefficient, the voltage preset value, or the voltage reference value and that is sent by the controller.

In this embodiment, when the power converter does not work in a maximum power point tracking state, a voltage of the power converter may still be controlled to be a voltage value that is proportional to a voltage of the photovoltaic module, to implement simulation of the voltage of the photovoltaic module, thereby helping overall control of the photovoltaic power generation system.

The voltage processor is further configured to, when a parameter represented by the adjustment signal exceeds a second preset threshold, control, by using the control signal, the power converter to work in a pass-through mode. The adjustment signal may be a pulse signal, and the parameter represented by the adjustment signal may be a pulse width, a duty cycle, a pulse frequency, a pulse amplitude, or the like of the adjustment signal. That is, one of the foregoing parameters may be selected for determining. When the parameter exceeds the second preset threshold, the power converter is controlled to work in the pass-through mode, that is, the input end and the output end are directly conducted, and no power conversion is performed between the input end and the output end.

Figure 8:
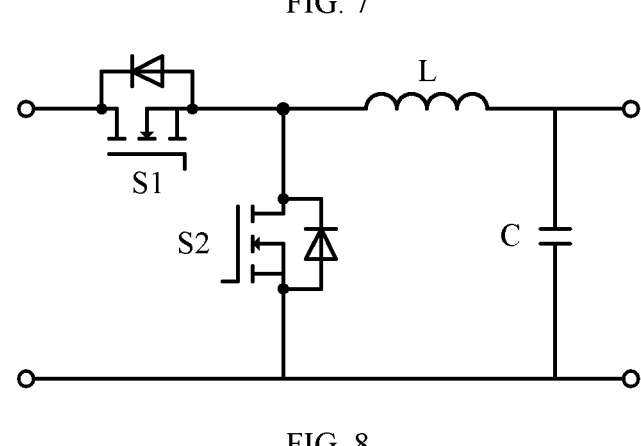
FIG. 8 is a schematic diagram of a power converter according to an embodiment of this application.

FIG. 8 is a schematic diagram of a power converter according to an embodiment of this application.

This embodiment provides description by using an example in which a topology of the power converter is a BUCK circuit. The power converter may be alternatively a circuit structure of another topology. This is not limited herein. The BUCK circuit includes a main switching transistor S1, a passive switching transistor S2, an inductor L, and an output capacitor C. The main switching transistor S1 is operated to implement power conversion.

Example types of S1 and S2 are not limited in this embodiment of this application. For example, S1 and S2 each may be a metal-oxide-semiconductor field-effect transistor (MOSFET), or may be an insulated-gate bipolar transistor (IGBT), or a diode.

When the multiplexer selects the adjustment signal as the control signal and the parameter represented by the adjustment signal does not exceed the preset threshold, the analog chip controls the power converter to work in a normal state. That is, the power converter converts a voltage and a current of the photovoltaic module into voltages and currents of different levels based on actual requirements, and transmits the voltages and the currents to the output end of the power converter. When the multiplexer selects the adjustment signal as the control signal and the parameter represented by the adjustment signal exceeds the preset threshold, the analog chip controls the power converter to enter the pass-through mode. In this case, in FIG. 8, the main switching transistor S1 is kept normally-on, and the passive switching transistor S2 is kept normally-off. Therefore, the output voltage of the power converter is equal to the input voltage, and the output current is equal to the input current, in other words, the power of the photovoltaic module is directly transmitted to the output end of the power converter.

In this embodiment, the analog chip has a function of controlling the power converter to work in the pass-through mode. When the photovoltaic module is not shielded, the power converter is allowed to directly transmit the power of the photovoltaic module to the output end without performing power conversion, to reduce a loss caused by the power converter and improve power generation efficiency of the entire photovoltaic power generation system.

In this embodiment, the circuit topology and the corresponding pass-through mode are described by using a BUCK circuit as an example, and may be alternatively applied to a case in which the power converter is a BOOST circuit, or the like. The pass-through mode control manner may also be correspondingly adjusted based on different circuit topologies.

When the multiplexer selects the protection signal as the control signal, the control signal is used to control the power converter to perform a pulse-by-pulse current limit, or control the power converter to stop working.

An example implementation of the pulse-by-pulse current limit is described by using, as an example, the power converter topology shown in FIG. 8. The control signal that is output by the analog chip is used to control conduction time of the main switching transistor S1 to decrease period by period until the main switching transistor S1 is not conducted. In this process, a current flowing from the input end of the power converter to the output end gradually decreases, to implement protection of the main switching transistor S1 and the passive switching transistor S2.

In this embodiment, the pulse-by-pulse current limit protection can prevent a temporary overvoltage or overcurrent phenomenon from occurring in the switching transistors in the power converter in a protection process, to protect the switching transistors. Based on different application scenarios and circuit topologies, if no overvoltage or overcurrent phenomenon occurs in the switching transistors in the protection process, the protection signal may be alternatively used to directly stop working of the power converter for protection.

In addition, in the analog chip provided in this embodiment of this application, when communication between the rapid shutdown circuit and the external controller of the analog chip is abnormal, the rapid shutdown circuit generates the rapid shutdown signal and send the rapid shutdown signal to the multiplexer to protect the power converter.

In this embodiment, if a communication link between the rapid shutdown circuit and the outside of the analog chip is abnormal, when the analog chip does not include the communication circuit, the rapid shutdown circuit determines that the communication link is abnormal; or when the analog chip includes the communication circuit, the communication circuit may determine that the communication link between the rapid shutdown circuit and the outside is abnormal, or the rapid shutdown circuit may determine that the communication link is abnormal.

When the control signal that is output by the analog chip is the rapid shutdown signal, the control signal is used to control the power converter to be rapidly discharged, or control the power converter to stop working.

The BUCK circuit shown in FIG. 8 is still used as an example for description. When the multiplexer selects the adjustment signal as the control signal, the control signal is used to discharge a capacitor of the power converter based on the adjustment signal, that is, the control signal is used to control the passive switching transistor S2 in the power converter to keep conducted or to be conducted for long time, to discharge the output capacitor C, to rapidly reduce the output voltage of the power converter to be at most the safe voltage.

If the input end of the power converter is connected to the photovoltaic module by using a cable or in another possible exposure manner, for example, the connection is exposed to a worker or another device, the control signal that is output by the analog chip may be used to control the active transistor S1 to also keep conducted or to be conducted for long time, to discharge the photovoltaic module, to rapidly reduce the input voltage of the power converter to be at most the safe voltage. In this process, it needs to be ensured that no overcurrent or overheat damage is caused to the passive switching transistor S2 or the main switching transistor S1. After the output voltage and the input voltage of the power converter are reduced, working of the power converter may be stopped, to finally implement rapid shutdown of the power converter, thereby ensuring safety of the worker and the device.

Based on different application scenarios and circuit topologies, the adjustment signal may be alternatively used to directly stop working of the power converter, and ensure that the output voltage and the input voltage of the power converter can be reduced to be at most the safe voltage in short time.

The analog chip provided in this embodiment of this application further has an I-V curve scanning function. The following describes the I-V curve scanning function in detail with reference to the accompanying drawings.

Figure 9:
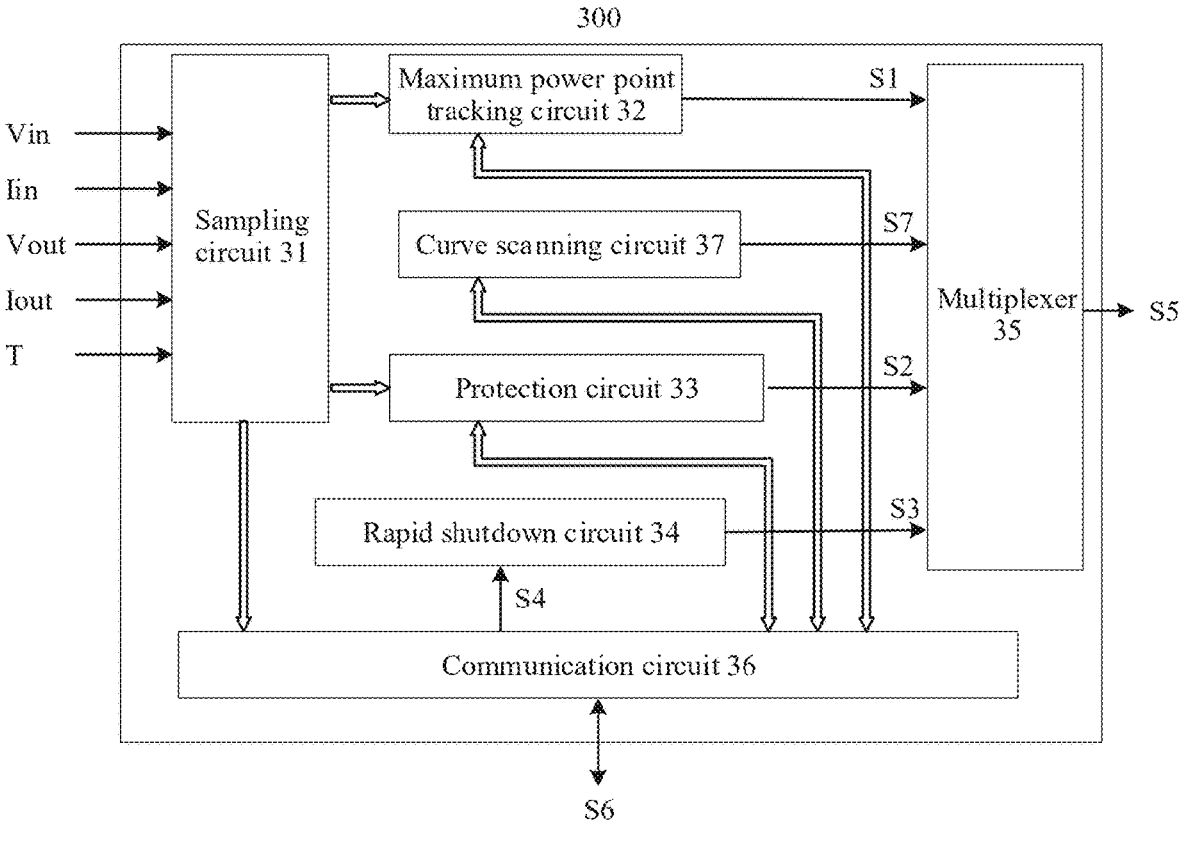
FIG. 9 is a schematic diagram of yet another analog chip according to an embodiment of this application.

FIG. 9 is a schematic diagram of yet another analog chip according to an embodiment of this application.

Because the input end of the power converter is connected to the photovoltaic module, the analog chip can implement curve scanning of a voltage and a current of the photovoltaic module.

In this embodiment, the analog chip 300 further includes a curve scanning circuit 37.

The curve scanning circuit 37 is configured to, when receiving a scanning instruction, generate a curve scanning start signal and send the curve scanning start signal to the multiplexer.

The multiplexer 35 is configured to select the control signal from the rapid shutdown signal, the protection signal, the curve scanning start signal, and the adjustment signal in descending order of priorities. When the curve scanning start signal is used as the control signal, the control signal is used to control the power converter to perform curve scanning on the input voltage and the input current or perform curve scanning on the output voltage and the output current.

In addition, in the analog chip 300 provided in this embodiment, the communication circuit 36 is further connected to the curve scanning circuit 37.

The communication circuit 36 is configured to send the curve scanning start signal and a curve scanning mode of the curve scanning circuit 37 to the controller; and is further configured to send, to the curve scanning circuit 37, a scanning adjustment instruction sent by the controller, where the scanning adjustment instruction is used to adjust the curve scanning mode and the curve scanning start signal.

The following provides descriptions by using an example in which the scanning instruction is generated by the external controller of the analog chip. That is, when receiving the scanning instruction from the outside of the analog chip 300, the curve scanning circuit 37 generates a valid curve scanning start signal and send the valid curve scanning start signal to the multiplexer 35. When receiving neither a valid adjustment signal nor a valid protection signal and receiving the valid curve scanning start signal, the multiplexer 35 uses the curve scanning start signal as the control signal, to control the power converter to scan an input-current-input-voltage curve or an output-current-output-voltage curve of the power converter in a preset curve scanning mode of the curve scanning circuit 37. The multiplexer 35 is further configured to select the control signal S5 from the rapid shutdown signal S3, the protection signal S2, the curve scanning start signal S7, and the adjustment signal S1 in descending order of the priorities, to ensure reliable operation of the power converter. The control signal S5 is configured to control the power component in the power converter. In other words, S5 may be one of S1, S7, S2, or S3. S3 has a highest priority, S2 has a second highest priority, S7 has a third highest priority, and S1 has a lowest priority. That is, when S1, S7, S2, and S3 are all valid, the multiplexer 35 selects S3 as the control signal for outputting, in other words, S5=S3. When S2, S7, and S1 are all valid, the multiplexer 35 selects S2 as the control signal for outputting, in other words, S5=S2. When S7 and S1 are both valid, the multiplexer 35 selects S7 as the control signal for outputting, in other words, S5=S7. When only S1 is valid, the multiplexer 35 selects S1 as the control signal for outputting, in other words, S5=S1.

When the analog chip 300 includes the communication circuit 36, the curve scanning circuit 37 may be further connected to the communication circuit 36. The communication circuit 36 may send a working status of the curve scanning circuit 37 to the outside of the analog chip 300 as a communication signal. The working status of the curve scanning circuit 37 includes a current curve scanning mode and curve scanning start signal. In addition, the external controller of the analog chip 300 may also send, to the chip, a scanning adjustment instruction for adjusting the working status of the curve scanning circuit 37. When receiving a communication signal including the scanning adjustment instruction, the communication circuit 36 may force the curve scanning circuit 37 to adjust the working status, that is, forcibly adjust the curve scanning mode and the curve scanning start signal.

The curve scanning mode may be entire I-V curve scanning, starting from an open-circuit voltage, with a same scanning step; or different scanning steps, or segmented I-V curve scanning.

The analog chip provided in this embodiment of this application further has the I-V curve scanning function, for example, may implement scanning of an input-current-input-voltage curve of the power converter, or may implement scanning of an output-current-output-voltage curve of the power converter, to implement monitoring of a voltage-current characteristic of the photovoltaic module, thereby improving monitoring and adjustment capabilities of the photovoltaic power generation system.

Power Converter Embodiment

Based on the power converter analog chip provided in the foregoing embodiment, an embodiment of this application further provides a power converter. An analog chip is integrated into the power converter, that is, the power converter includes a power conversion circuit and the analog chip. The following describes the power converter in detail with reference to the accompanying drawings.

Figure 10:
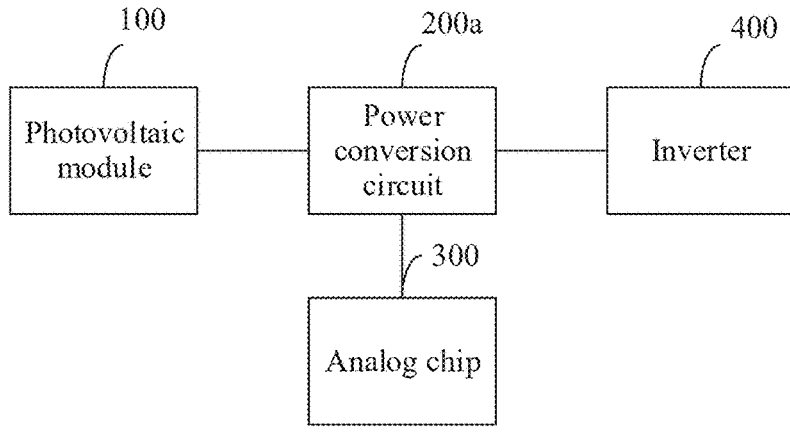
FIG. 10 is a schematic diagram of a photovoltaic power generation system according to an embodiment of this application.

FIG. 10 is a schematic diagram of a photovoltaic power generation system according to an embodiment of this application.

The photovoltaic power generation system provided in this embodiment of this application includes a power conversion circuit 200a and the analog chip 300 described in the foregoing embodiment.

An input end of the power conversion circuit 200a is configured to be connected to a photovoltaic module, and an output end of the power conversion circuit 200*a* is configured to be connected to an inverter 400.

The analog chip 300 is configured to output a control signal to the power conversion circuit 200*a,* where the control signal is used to control the power conversion circuit 200*a* to perform power conversion. That is, the control signal that is output by the analog chip 300 may be a pulse-width modulated (PWM) signal, to control an action of a switching transistor in the power conversion circuit 200*a.* For example, when a topology of the power conversion circuit 200*a* is the circuit shown in FIG. 8, the control signal is used to control actions of S1 and S2.

This embodiment provides description by using an example in which the output end of the power conversion circuit 200*a* is connected to the inverter 400. In addition, a combiner box may be further included between the power conversion circuit 200*a* and the inverter 400.

The photovoltaic power generation system provided in this embodiment includes the analog chip. The analog chip can control the power converter to perform normal power conversion to provide electric energy of the photovoltaic module for the inverter, and can also implement a relatively large quantity of functions such as protection, rapid shutdown, and curve scanning. Because there is a large quantity of power converters in the photovoltaic power generation system provided in this embodiment of this application, and one control chip needs to be configured for each power converter, if a digital chip is used for implementation, costs are relatively high. However, if the analog chip provided in the foregoing embodiment is used, costs of the photovoltaic power generation system are greatly reduced.

It should be understood that, in this application, "at least one" means one or more, and "a plurality of" means two or more. Any simple modification, equivalent change, and modification made to the foregoing embodiments based on the technical essence of this application without departing from the content of the technical solutions of this application all still fall within the protection scope of the technical solutions of this application.

What is claimed is:

1. A power converter analog chip, comprising:
a sampling circuit configured to receive electrical parameters from a power converter;
a maximum power point tracking circuit coupled to the sampling circuit, wherein the maximum power point tracking circuit is configured to:
obtain at least one of input power of the power converter or output power of the power converter based on the electrical parameters;
perform maximum power point tracking based on the input power of the power converter or the output power of the power converter to obtain an adjustment signal; and
send the adjustment signal;
a protection circuit coupled to the sampling circuit, wherein the protection circuit is configured to:
generate a protection signal when an electrical parameter of the power converter exceeds a first preset threshold; and
send the protection signal;
a rapid shutdown circuit configured to:
receive a rapid shutdown instruction;
generate a rapid shutdown signal based on the rapid shutdown instruction; and
send the rapid shutdown signal; and a multiplexer coupled to the maximum power point tracking circuit, the protection circuit, and the rapid shutdown circuit, wherein the multiplexer is configured to:
receive the rapid shutdown signal from the rapid shutdown circuit;
receive the protection signal from the protection circuit;
receive the adjustment signal from the maximum power point tracking circuit;
select from one of the rapid shutdown signal, the protection signal, or the adjustment signal as a control signal; and
control a power component in the power converter using the control signal.

2. The power converter analog chip of claim 1, wherein the multiplexer is further configured to further select the control signal from one of the rapid shutdown signal, the protection signal, or the adjustment signal according to a descending order of their priorities.

3. The power converter analog chip of claim 1, further comprising a communication circuit coupled to the rapid shutdown circuit and to the sampling circuit, wherein the communication circuit is configured to:
forward, to the rapid shutdown circuit, the rapid shutdown instruction; and
send the electrical parameters to a multiplexer; and
wherein the multiplexer is configured to monitor operation of the power converter based on the electrical parameters.

4. The power converter analog chip of claim 3, wherein the communication circuit is further configured to:
send, to the controller, at least one of the control signal or a control signal selection result of the multiplexer; or
send, to the multiplexer, a mandatory selection instruction from the controller, and
wherein the multiplexer is further configured to select the control signal from at least one of the rapid shutdown signal, the protection signal, or the adjustment signal based on the mandatory selection instruction.

5. The power converter analog chip of claim 3, wherein the maximum power point tracking circuit comprises:
a multiplier configured to obtain at least one of the input power or the output power based on voltages and currents in the electrical parameters;
a maximum power point tracker coupled to the multiplier, wherein the maximum power point tracker is configured to perform maximum power point tracking based on the input power or the output power to obtain a voltage reference value; and
a voltage processor coupled to the maximum power point tracker, wherein the voltage processor is configured to obtain the adjustment signal based on the voltage reference value and an input voltage or an output voltage in the electrical parameters.

6. The power converter analog chip of claim 5, wherein the maximum power point tracking circuit further comprises a voltage simulator coupled to the voltage processor, wherein the voltage simulator is configured to obtain a voltage preset value based on a preset coefficient and the input voltage or the output voltage, and wherein the voltage processor is further configured to:
compare the voltage reference value with the voltage preset value to obtain a comparison result; and
obtain the adjustment signal based on the comparison result and either the input voltage or the output voltage.

7. The power converter analog chip of claim 5, wherein the maximum power point tracker is further configured to:

store the input power or the output power from the multiplier as memory power; and compare real-time power of a photovoltaic module with the memory power to obtain the voltage reference value.

8. The power converter analog chip of claim 5, wherein the voltage processor is further configured to control, using the control signal, the power converter to work in a pass-through mode when a parameter represented by the adjustment signal exceeds a second preset threshold.

9. The power converter analog chip of claim 5, wherein the communication circuit is coupled to the maximum power point tracking circuit, wherein the communication circuit is further configured to perform at least one of:

send, to the controller, the power of the power converter or the adjustment signal, wherein the power of the power converter is at least one of the input power or the output power; or send a power adjustment instruction of the controller to the maximum power point tracking circuit, wherein the power adjustment instruction enables the controller to adjust the power of the power converter or the adjustment signal.

10. The power converter analog chip of claim 5, wherein the communication circuit is coupled to the maximum power point tracking circuit, wherein the communication circuit is further configured to perform at least one of sending the voltage reference value to the controller or forwarding, to the voltage processor, an instruction for adjusting the voltage reference value, and wherein the instruction is received from the controller.

11. The power converter analog chip of claim 6, wherein the communication circuit is coupled to the maximum power point tracking circuit, wherein the communication circuit is further configured to perform at least one of sending at least one of the preset coefficient, the voltage preset value, or the voltage reference value to the controller or forwarding, to the voltage processor, an instruction for adjusting at least one of the preset coefficient, the voltage preset value, or the voltage reference value, and wherein the instruction is received from the controller.

12. The power converter analog chip of claim 3, wherein the communication circuit is connected to the protection circuit, and wherein the communication circuit is further configured to:

send the first preset threshold and the protection signal to a controller;

receive, from the controller, a protection adjustment instruction; and send the protection adjustment instruction to the protection circuit, wherein the protection adjustment instruction enables the protection circuit to adjust the first preset threshold or the protection signal.

13. The power converter analog chip of claim 1, wherein the control signal enables the power converter analog chip to be configured to control the power converter to perform a pulse-by-pulse current limit or control the power converter to be disabled.

14. The power converter analog chip of claim 1, wherein when communication between the rapid shutdown module and the controller is abnormal, the rapid shutdown circuit is configured to:

generate the rapid shutdown signal; and send the rapid shutdown signal to the multiplexer.

15. The power converter analog chip of claim 1, wherein when the control signal is the rapid shutdown signal, the control signal enables the power converter analog chip be configured to control the power converter to rapidly discharge or to be disabled.

16. The power converter analog chip of claim 3, further comprising a curve scanning circuit, wherein the curve scanning circuit is configured to:

generate a curve scanning start signal based on a scanning instruction; and send the curve scanning start signal to the multiplexer, wherein the multiplexer is further configured to:

select the control signal from one of the rapid shutdown signal, the protection signal, the curve scanning start signal, or the adjustment signal in descending order of priority; and control the power converter to perform curve scanning on the input voltage and an input current when the curve scanning start signal is used as the control signal or perform curve scanning on the output voltage and an output current when the curve scanning start signal is used as the control signal.

17. The power converter analog chip of claim 16, wherein the communication circuit is coupled to the curve scanning circuit, and wherein the communication circuit is configured to:

send the curve scanning start signal and a curve scanning mode of the curve scanning circuit to the controller; and send, to the curve scanning circuit, a scanning adjustment instruction from the controller, wherein the scanning adjustment instruction enables the curve scanning circuit to adjust the curve scanning mode and the curve scanning start signal.

18. A power converter, comprising:

a power conversion circuit comprising:

an input end configured to couple to a photovoltaic module; and an output end configured to couple to a combiner box or an inverter; and an analog chip coupled to the power conversion circuit, wherein the analog chip is configured to output a control signal to the power converter, and wherein the analog chip comprises:

a sampling circuit configured to receive electrical parameters from a power converter;

a maximum power point tracking circuit coupled to the sampling circuit, wherein the maximum power point tracking circuit is configured to:

obtain at least one of input power of the power converter or output power of the power converter based on the electrical parameters;

perform maximum power point tracking based on the input power of the power converter or the output power to obtain an adjustment signal; and send the adjustment signal;

a protection circuit coupled to the sampling circuit, wherein the protection circuit is configured to:

generate a protection signal when an electrical parameter of the power converter exceeds a first preset threshold; and send the protection signal;

a rapid shutdown circuit configured to:
  receive a rapid shutdown instruction;
  generate a rapid shutdown signal based on the rapid
    shutdown instruction; and
  send the rapid shutdown signal; and
a multiplexer coupled to the maximum power point
  tracking circuit, the protection circuit, and the rapid
  shutdown circuit, wherein the multiplexer is config-
  ured to:
  receive the rapid shutdown signal from the rapid
    shutdown circuit;
  receive the protection signal from the protection
    circuit;
  receive the adjustment signal from the maximum
    power point tracking circuit;
  select from one of the rapid shutdown signal, the
    protection signal, or the adjustment signal as a
    control signal; and
  control a power component in the power converter
    using the control signal.

19. The power converter to claim 18, wherein the multi-
plexer is further configured to:
  further select the control signal from one of the rapid
    shutdown signal, the protection signal, or the adjust-
    ment signal according to a descending order of their
    priorities; and
  control the power component using the control signal.

20. The power converter of claim 18, further comprising
a communication circuit coupled to the rapid shutdown
circuit and to the sampling circuit, wherein the communi-
cation circuit is configured to:
  forward, to the rapid shutdown circuit, the rapid shutdown
    instruction; and
  send the electrical parameters to a multiplexer, and
  wherein the multiplexer is configured to monitor opera-
    tion of the power converter based on the electrical
    parameters.

* * * * *